United States Patent [19]
Hisamatsu et al.

[11] Patent Number: 5,993,637
[45] Date of Patent: Nov. 30, 1999

[54] ELECTRODE STRUCTURE, ELECTROLYTIC ETCHING PROCESS AND APPARATUS

[75] Inventors: Masaya Hisamatsu, Kawasaki; Akio Hasebe, Nagahama; Tsutomu Murakami, Nara; Hirofumi Ichinose, Tokyo; Satoshi Shinkura, Nagahama; Yukie Ueno, Nara, all of Japan

[73] Assignee: Canon Kabushiki Kaisha, Tokyo, Japan

[21] Appl. No.: 08/984,046

[22] Filed: Dec. 3, 1997

[30] Foreign Application Priority Data

Dec. 6, 1996 [JP] Japan ................................ 8-326776

[51] Int. Cl.$^6$ ................................ C25F 3/12; C25F 7/00
[52] U.S. Cl. ................ 205/652; 205/656; 205/658; 205/659; 205/671; 205/674; 204/224 M; 204/272; 204/273; 204/289; 204/292; 204/293; 204/294
[58] Field of Search ................ 204/242, 272, 204/292, 293, 294, 267, 222, 224 M, 290 R, 280, 289, 273; 205/652, 658, 659, 674, 661, 671, 656

[56] References Cited

U.S. PATENT DOCUMENTS

| 2,827,427 | 3/1958 | Barry et al. ........................ 205/652 |
| 2,861,932 | 11/1958 | Pohl ........................ 205/656 |
| 3,325,384 | 6/1967 | Frantzen ........................ 205/652 |
| 4,236,992 | 12/1980 | Themy ........................ 204/242 X |
| 4,337,136 | 6/1982 | Dahlgren ........................ 204/242 |
| 4,419,530 | 12/1983 | Nath ........................ 136/251 |
| 4,869,881 | 9/1989 | Collins ........................ 204/290 R X |
| 5,062,933 | 11/1991 | Nakano ........................ 205/652 |
| 5,286,944 | 2/1994 | Li ........................ 204/289 X |
| 5,507,932 | 4/1996 | Robinson ........................ 204/290 R X |

FOREIGN PATENT DOCUMENTS

| 55-108779 | 8/1980 | Japan . |
| 62-290900 | 12/1987 | Japan . |
| 5-93300 | 4/1993 | Japan . |

*Primary Examiner*—Donald R. Valentine
*Attorney, Agent, or Firm*—Fitzpatrick, Cella, Harper & Scinto

[57] ABSTRACT

An electrode structure is constituted by a first electrode, and at least one second electrode providing a pair of opposite portions with a prescribed spacing therebetween at which the first electrode is disposed. The electrode structure is suitably used for electrolytic etching and is effective in providing an accurate etching pattern without damaging the surface of an etching object.

49 Claims, 9 Drawing Sheets

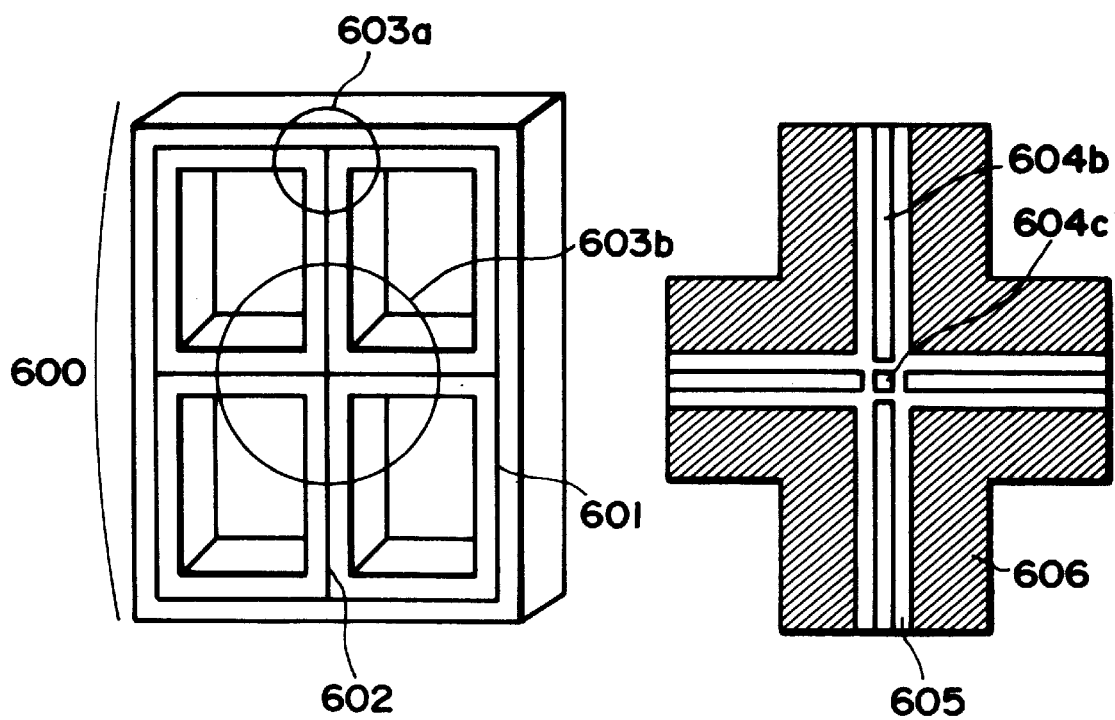
FIG. 6A
FIG. 6C
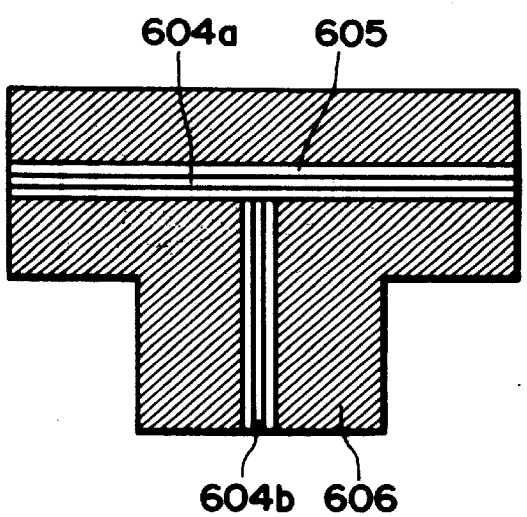
FIG. 6B

ELECTRODE STRUCTURE, ELECTROLYTIC ETCHING PROCESS AND APPARATUS

FIELD OF THE INVENTION AND RELATED ART

The present invention relates to an electrode structure suitable for use in electrolytic etching wherein an etching object (an object or matter to be etched) is dissolved by electrochemical reaction, an electrolytic etching process and apparatus using the electrode, and a process for producing a photo-electricity generating device using the electrolytic etching process. More specifically, the present invention relates to a counter electrode for effecting a partial etching or a pattern etching by utilizing electrolytic reaction and an electrolytic etching process using the electrode.

There have been heretofore known chemical etching processes, as an etching process for a metal film or a transparent electroconductive film, as described in Japanese Laid-Open Patent Application (JP-A) 55-108779 and U.S. Pat. No. 4,419,530.

In these processes, etching is performed by forming a positive pattern on a transparent electroconductive film through silk screen printing or by using a photoresist and then by treating a part of the electroconductive film corresponding to an exposed portion (negative portion) with an etchant, such as a ferric chloride solution or nitric acid (under no electric field application).

As another process for effecting a partial etching or patterning (pattaern formation) by using electrolytic reaction, there have been proposed processes for performing electrolytic etching after a pretreatment wherein an etching object is coated with a resist and exposed to light to cure the resist thereby to form a prescribed pattern. For instance, JP-A 62-290900 discloses a process wherein a resist pattern formed on an electroconductive film in an intimate contact state is immersed in a hydrochloric acid solution under application of an electric field to dissolve a portion of the film on which the resist is not formed, thus effecting patterning and then by removing the resist from the film to complete the electrolytic etching. Such a process has been performed by using an electrolytic etching apparatus 1000 as shown in FIG. 10 including a flat-plate counter electrode 1001, an etching object 1002 provided with a desired pattern (resist pattern) as a working electrode, an electrolysis solution 1003, an electrolytic tank 1004, a power supply (source) 1005, a switching mechanism 1006 and a timer 1007. The electrolysis treatment is performed between the counter electrode 1001 and the working electrode 1002 in the electrolysis solution 1003.

Further, as a process in which the pre-treatment (the treatment for forming the resist pattern on the etching object) is not performed, there has been proposed an electrolytic etching process wherein a probe electrode is inserted into a capillary with an opening at its tip portion and a small gap between the opening face and the surface of a working electrode (etching object to be etched) is provided, thus effecting the electrolysis while flowing an electrolysis solution through the opening, as described in JP-A 5-93300.

However, the above-described processes were accompanied with the following difficulties.

The chemical etching processes (JP-A 55-108779 and U.S. Pat. No. 4,419,530) are required to effect steps of applying a resist onto an etching object and of removing the resist from the etching object, thus resulting in a complicated process and an increased treating cost. Further, depending on the kinds of the etching object, a longer treating time is required in some cases due to its lower reaction speed. Moreover, the chemical etching process fails to effect a noncontact treatment (a treatment with no application and removal of the resist) as a whole, thus lowing a production yield.

Similarly, the electrolytic etching process (JP-A 62-290900) utilizing the electrolytic reaction is essentially required to effect the resist application (pre-treatment) and the removal thereof (post-treatment) although it is possible to effect the noncontact treatment during the electrolysis, thus failing to perform the complete noncontact treatment as a whole. Consequently, the treating cost cannot be reduced and many steps are required to lower the production yield.

The electrolytic etching process free from the pre-treatment (and also the post-treatment) is a pinpoint etching technique although the process allows the noncontact treatment, so that it is difficult to effect a pattern control due to the diffusion or distribution of the electrolysis solution in a planar direction. Further, when such a process is adopted in patterning of a wide area, a resultant etching pattern is accompanied with an ununiform edge line and a longer treating time.

SUMMARY OF THE INVENTION

In view of the above-mentioned problems, an object of the present invention is to provide an electrode structure allowing patterning of an etching object by a noncontact treatment with no pre-treatment thereby to lower a mechanical damage to the etching object.

Another object of the present invention is to provide an electrode structure effective in performing accuracy patterning to an etching object through a treatment in an electrolysis solution in a short period of time.

A further object of the present invention is to provide process and apparatus for electrolytic etching using the electrode structure.

A still further object of the present invention is to provide a process for producing a photo-electricity generating device using the electrolytic etching process.

According to the present invention, there is provided an electrode structure, comprising: a first electrode, and at least one second electrode providing a pair of opposite portions with a prescribed spacing therebetween at which the first electrode is disposed.

According to the present invention, there is also provided in an electrolytic etching process, comprising:

immersing an electrode structure and an etching object providing a gap therebetween in an electrolytic solution, and supplying a current passing through the gap to dissolve at least a part of the etching object, wherein the electrode structure comprises a first electrode, and at least one second electrode providing a pair of opposite portions with a prescribed spacing therebetween at which the first electrode is disposed.

According to the present invention, there is further provided an electrolytic etching apparatus, comprising:

an electrode structure comprising a first electrode, and at least one second electrode providing a pair of opposite portions with a prescribed spacing therebetween at which the first electrode is disposed;

an etching object immersed together with the electrode structure in an electrolytic solution while leaving a gap with the electrode structure; and means for supplying a current passing through the gap to dissolve at least a part of the etching object.

According to the present invention, there is still further provided a process for producing a photoelectricity generating device, comprising:

immersing an electrode structure and an etching object providing a gap therebetween in an electrolytic solution, the etching object comprising at least a semiconductor layer and an electroconductive surface layer, and supplying a current passing through the gap to dissolve at least a part of the electroconductive surface layer of the etching object to effect a patterning of the electroconductive surface layer, wherein the electrode structure comprises a first electrode, and at least one second electrode providing a pair of opposite portions with a prescribed spacing therebetween at which the first electrode is disposed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 6A is a schematic perspective view showing another embodiment of the electrode according to the present invention and FIGS. 6B and 6C are respectively a partially enlarged view thereof.

DESCRIPTION OF THE PREFERRED EMBODIMENTS

Figure 1A:
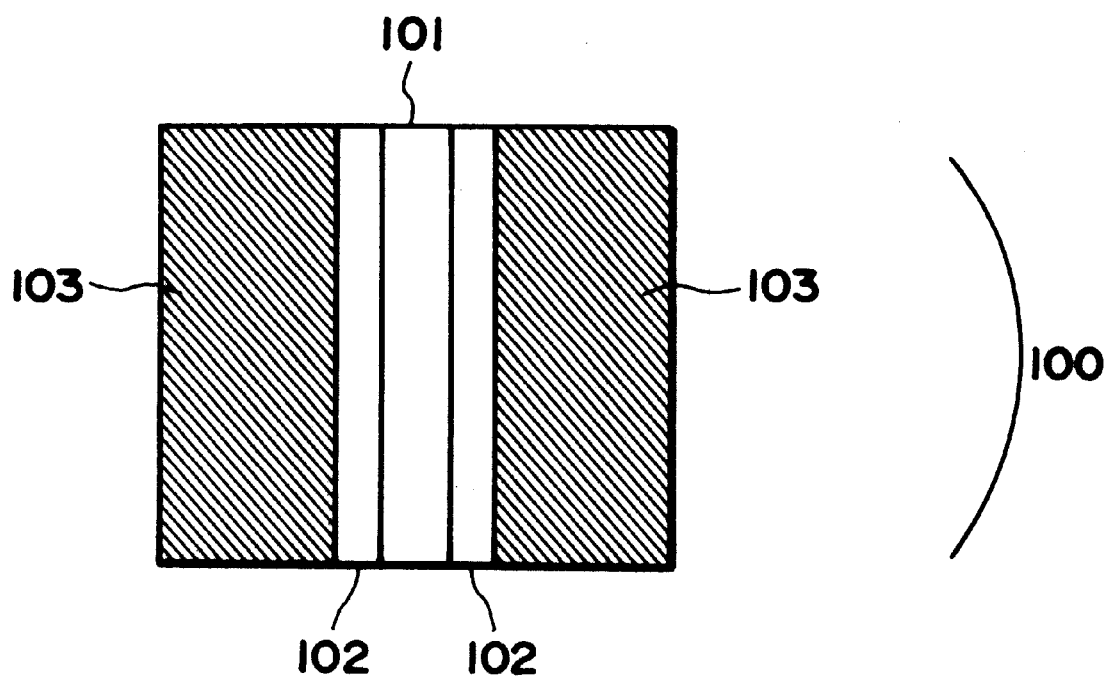
FIG. 1A is a schematic sectional view showing an embodiment of the electrode according to the present invention and FIGS. 1B–1D are respectively an embodiment of a schematic perspective view thereof.

The electrode according to the present invention is suitably used as an electrode for electrolytic etching but may be applicable to an electrode for other purposes, such as electrolytic polishing and electrolytic cleaning.

In the present invention, the sizes and shapes of the first electrode and second electrode may preferably be designed depending on those of a desired etching pattern (etching region), whereby it becomes possible to effect complicated patterning including a curved patterning and a combination of a linear patterning and a curved patterning in addition to a simple linear patterning. In this instance, the first electrode is designed to have an exposed surface shape corresponding to a shape of an intended etching pattern, thus allowing omission of the application and removal steps of a resist for patterning.

The second electrode may preferably be used as an auxiliary electrode for regulating the etching region, thus facilitating the control of the patterning.

In the present invention, the first electrode and second electrode may preferably be electrically isolated (insulated) from each other by providing a spacing of an insulating member or a gap (empty space) between the first and second electrode members, whereby the patterning control becomes easy. The degree of insulating properties of the insulating member and the gap may appropriately be controlled depending on, e.g., the patterning accuracy required.

The first electrode and the second electrode may preferably have mutually different polarities, thus enabling the control of a width and depth of the etching pattern.

Further, a distance between the first and second electrode members may desirably be set to 0.05–2.0 mm, thus allowing a patterning of a minute region, such as a thin line.

In the present invention, the width and depth of the etching pattern may preferably be controlled by appropriately setting a relationship between the distance between the first and second electrode members and that between the first electrode and the etching object. The latter distance may preferably be at most five times the former distance, whereby it becomes possible to effect a precise and complicated patterning.

In order to stably performing the patterning for a long period of time, the first electrode may desirably comprise a material, such a Pt, Au, C or their alloys.

In the present invention, a current flowing a gap between the electrode (counter electrode) and the etching object (working electrode) may preferably comprise a direct current (DC), a pulse current or an alternating current (AC). Depending on the shape and size of the etching region required and the patterning accuracy required, the kind of an applied current may appropriately be selected.

In the present invention, an electrolysis solution used for the electrolytic etching may suitably comprise Lewis acid, Lewis base, a solution of Lewis acid or a solution of Lewis base. Lewis acid and Lewis base can become charged carriers by accepting and donating a pair of electrons, respectively, so that the electrolytic reaction can be promoted without generating a large amount of hydrogen ion, thus minimizing an occurrence of problematic bubbles during the electrolytic etching.

In order to remove such bubbles generated at the exposed surface of the first electrode or the entire surface of the electrode, it is preferred to provide a wiping means (wiper) or an ultrasonic wave-generating means, thus avoiding a patterning failure (e.g., shortage or breaking of a patterning line) even in a continuous etching treatment.

In the present invention, the etching object may preferably comprise a substrate on which a transparent electroconductive film or a metal layer is formed. The resultant patterned (etched) substrate may appropriately be applicable to production of various devices and apparatus of a transmission-type or a reflection-type, including: a photoelectricity generating device, such as a solar cell (module) or a sensor; a photosensitive apparatus; a self-(photo)emission type device, such as an electro-luminescent (EL) device; a liquid crystal device; and an electrochromic device. Among these devices, the substrate (etching object) and the electrode may particularly suitably be used in the production process of a photoelectricity generating device according to the present invention, whereby a photoelectricity generating device excellent in appearance, characteristics and reliability can be produced.

Hereinbelow, the electrode, electrolytic etching apparatus and electrolytic etching process according to the present invention will be described more specifically based on an electrode for electrolytic etching as an example.

<Electrode for Electrolytic Etching>

Figure 1B:
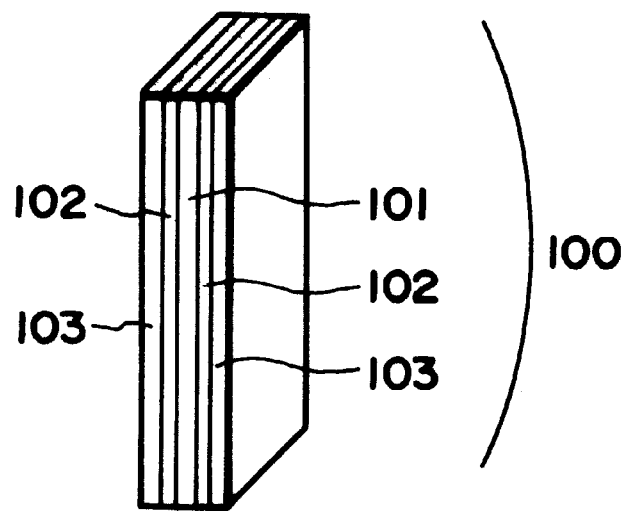

FIG. 1A is a schematic sectional view of an embodiment of the electrode structure of the present invention for use in electrolytic etching, and FIG. 1B is an example of a schematic perspective view thereof.

Referring to the figures, an electrode structure 100 includes a plate-shaped first electrode 101, two plate-shaped insulating members 102 disposed outside the first electrode 101 and two plate-shaped second electrodes 103 disposed outside the insulating members 102. In the present invention, the insulating members 102 and the second electrodes 103 may each be formed in a single member so as to surround or enclose the first electrode 101, respectively, as shown in FIGS. 1C and 1D, whereby an etching accuracy is further improved when used in the electrolytic etching process described hereinafter.

Figure 1C:
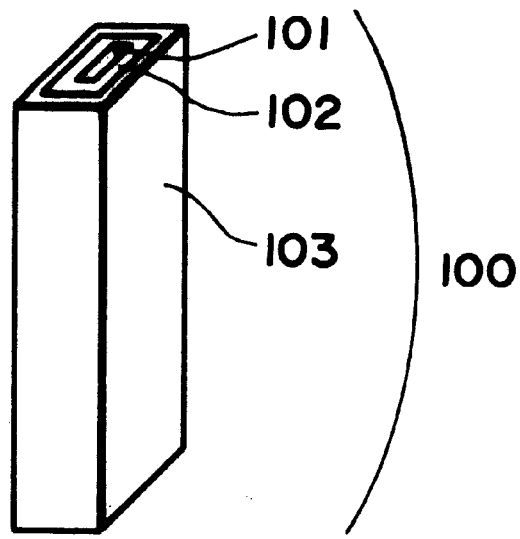
Figure 1D:
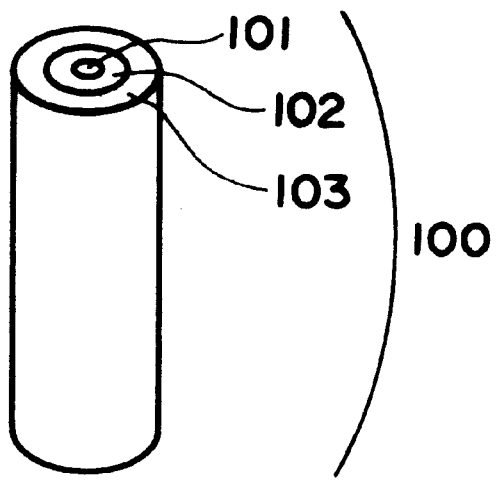

Herein, with respect to the second electrode(s) 103, the term "a pair of opposite portions" means that these portions are present in two second electrodes 103 in the case of FIG. 1B and present in one second electrode 103 in the case of FIGS. 1C and 1D, respectively.

The first electrode 101 and the second electrodes 103 are electrically insulated (isolated) from each other by the insulating members 102.

In this embodiment, the exposed surface (lower surface in FIGS. 1A and 1B) of the first electrode 101 is designed to form a flat (even) surface (or substantially flat surface) together with the associated surfaces of the insulating members 102 and second electrodes 103. In other words, these exposed surfaces of these members 101, 102 and 103 (i.e., the lower surface of the electrode structure 100 in FIGS. 1A and 1B) are substantially placed in a common or single plane (flat surface) and are well aligned with each other, thus enhancing the etching accuracy. The term "substantially" means that the resultant exposed surface is allowed to have a slight unevenness, preferably an unevenness of at most 500 $\mu$m.

The first electrode 101 and second electrodes 103 may comprise electroconductive materials, such as metallic materials, examples of which may include platinum (Pt), gold (Au), carbon (C), stainless steel, nickel (Ni), copper (Cu), lead (Pb) and alloys of these metals. Among these, Pt, Au and C may suitably be used in the present invention since they are chemically stable and readily formed in a desired shape.

The insulating members 102 may preferably comprise a material free from absorption of an electrolysis solution and with no deformation and degradation due to the absorption. In view of a durability, epoxy resin, phenolic resin and silicone resin may preferably be used after formed in a prescribed shape (e.g., plate (sheet) or tube).

The insulating members 102 are not necessarily required to have high insulating properties. In this regard, e.g., a semi-insulating material may have an electrical conductivity of at most $\frac{1}{10}$ of that of the electrolysis solution (etchant) used, thus controlling fine patterning conditions.

(Electrolytic Etching Apparatus)

Figure 2:
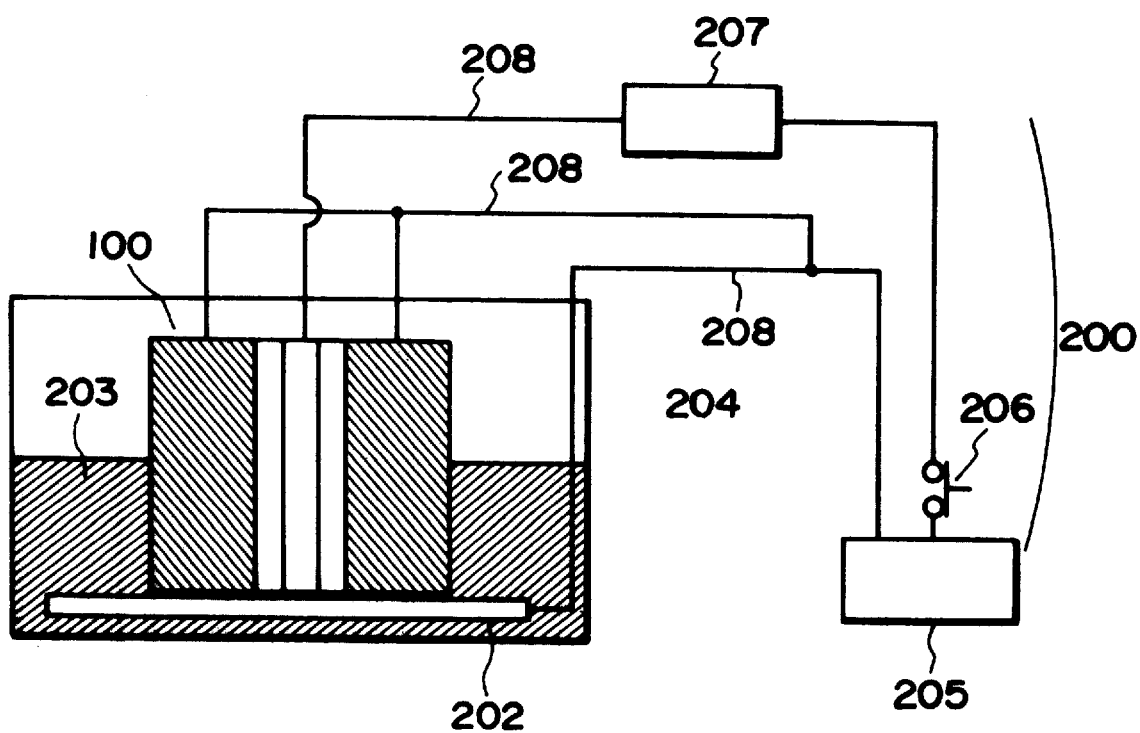
FIG. 2 is a schematic illustration of an embodiment of the electrolytic etching apparatus of the present invention.

FIG. 2 shows an embodiment of the electrolytic etching apparatus of the present invention using the electrode structure 100 shown in FIGS. 1A and 1B.

Referring to FIG. 2, an electrolytic etching apparatus 200 includes: an electrolytic etching tank (bath) 204; an electrode structure (electrolytic etching electrode structure) 100 and an etching object 202 disposed within the tank 204; current-adjusting members (an power supply 205, a switching mechanism 206, a timer 207 and electric (conductor) wires 208) for regulating a current applied to the electrode structure 100 and etching object 202; and an electrolysis solution 203 contained in the tank 204.

The electrolytic etching electrode structure 100 may be designed to have an appropriate shape depending on a given etching pattern. Examples of so designed electrode for electrolytic etching may include electrode structures 400 and 600 shown in FIGS. 4A and 6B, respectively, described hereinafter.

The electrolysis solution 203 is a medium for causing an electrochemical reaction, thus showing an appropriate electrical or ionic conductivity. Examples of the electrolysis solution 203 may include a liquid acid or base by itself and electrolytic solutions of acid, base and salts thereof. In the present invention, Lewis acid, Lewis base or their solutions may preferably be used a the electrolysis solution 203. More specifically, depending on a material for an etching portion (portion to be etched) of the etching object 202, an appropriate electrolysis solution may appropriately be selected from various liquids including: aqueous solutions of, e.g., sodium chloride, potassium chloride, aluminum chloride, zinc chloride, tin chloride, ferric chloride sodium nitrate, and potassium nitrate; acids, such as hydrochloric acid, nitric acid and sulfuric acid; and solutions of these acids diluted with water.

As the electrolysis 203 comprises, e.g., the acid as described above, the electrolytic etching tank 204 may preferably be made of a less corrosive material, examples of which may include vinyl chloride resin and acrylic resin which have a corrosion resistance to prevent an occurrence of rust and are light in weight and readily shaped.

As shown in FIG. 2, the electrolytic etching electrode structure 100 and the etching object 202 are connected with the power supply 205 via the electric wires 208, respectively. The power supply supplies a current to the electrode structure 100 and the etching object 202 and is appropriately turned on and shut off to control a current application time by using the switching mechanism 206 and the timer 206 in combination.

In this embodiment, the applied (supplied) current may appropriately be selected from a direct current (DC), a pulse current and an alternating current (AC) and an amount of the current may also appropriately be adjusted, thus controlling a selectivity and accuracy of the patterning.

(Patterning by Electrolytic Etching)

In this embodiment, the electrode structure 100 may preferably include the first electrode 101 and the second electrode 103 which have polarities different from each other. The polarity of the first electrode 101 is set to be also different from that of the etching object 202 used as a working electrode, whereby the electrolytic etching is performed. The second electrode 103 has a polarity identical to that of the etching object 202, thus functioning as an auxiliary electrode for regulating the etching region. More specifically, as shown in FIG. 2, the second electrode 103 is electrically connected with the etching object 202 so as to have an equipotential level (i.e., mutually identical electric potential) and the first electrode 101 is electrically connected so as to constitute a counter electrode to the etching object 202, whereby the second electrode 103 functions as the auxiliary electrode of the first electrode 102 as the counter electrode. Further, it is possible to provide a potential difference between the first electrode 101 and the second electrode 103, as desired, by using another external power supply (not shown).

After the arrangement of the respective electrodes may appropriately be determined as described above, the electrolytic etching conditions may also be appropriately controlled to obtain a desired etching pattern.

Figure 3:
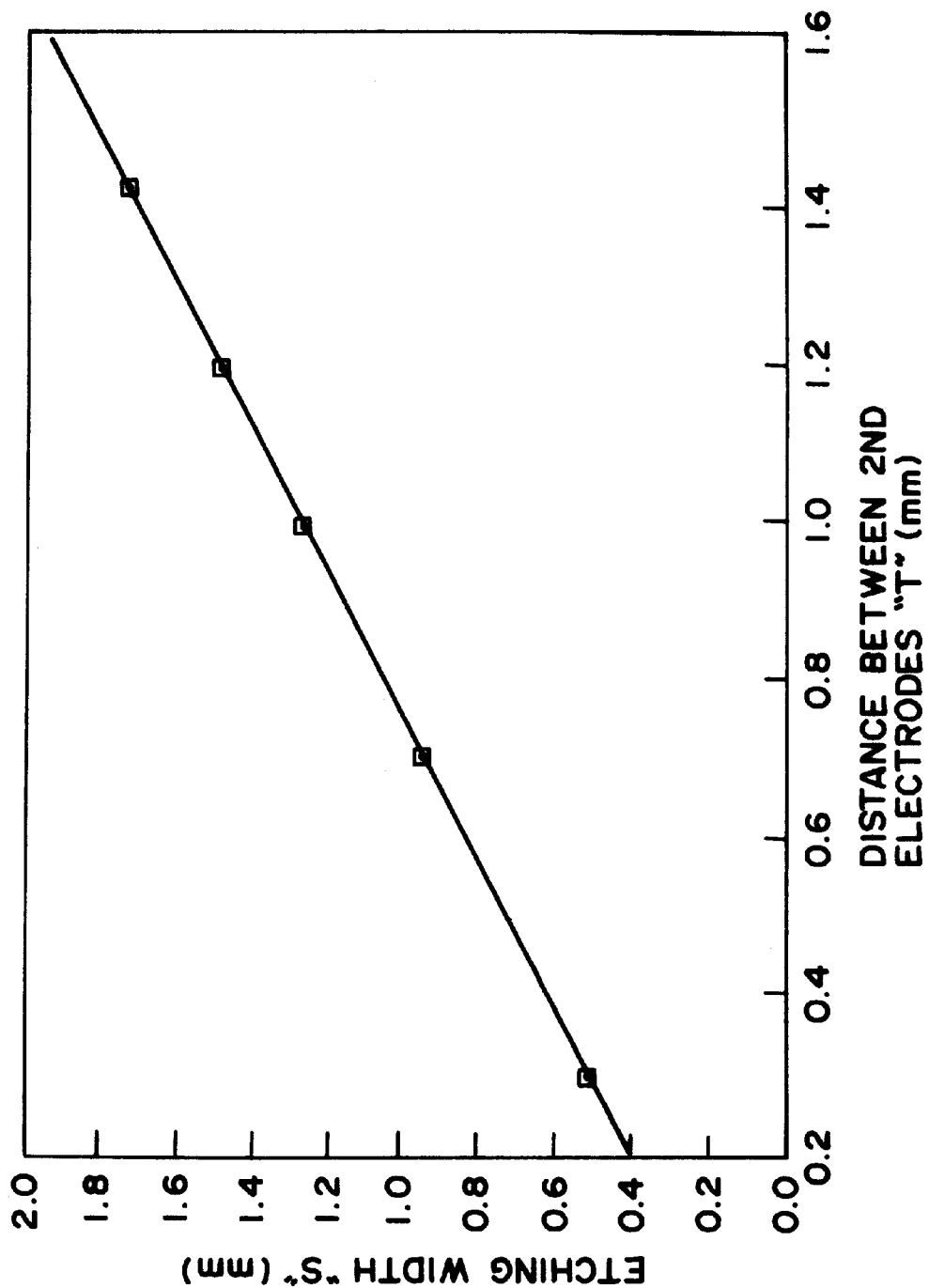
FIG. 3 is a graph showing an embodiment of a relationship between an etching width and an entire width of a first electrode and insulating member(s).

In the case where a partial etching or patterning is performed under an equipotential relationship between the etching object 202 and the second object 103, the entire width (thickness) of the first electrode 102 and the insulating members 102 sandwiching the first electrode 102 therebetween (i.e., a distance between the second electrodes 103) "T" constituting a central pattern of the electrode 100 has a prescribed linear relationship with an etching width "S" as shown in FIG. 3. The data shown in FIG. 3 are obtained under electrolytic conditions including an applied current (DC; 0.2 A), a current application for 0.2 sec., and an electrolytic solution (8.0 wt. %-aluminum chloride hydrate aqueous solution providing an electric conductivity of 65 mS/cm). Accordingly, when the electrode structure 100 is constituted by disposing the above-mentioned two second electrodes 103 on both sides (outsides) of the first electrode 101 via the above-mentioned two insulating members 102, respectively, as shown in FIG. 1, the etching width ("S") can be controlled by appropriately setting the distance between the second electrodes 103, i.e., the entire width of one insulating member 102/first electrode 101/the other insulating member 102 ("T").

Each insulating member 102 may preferably have a width (thickness) "t" (mm) satisfying a relationship: t≧L where "L" (mm) represents a gap between the electrode structure 100 and the etching object 202. Even if the width of the insulating member 102 is below the gap between the electrode 100 and the etching object 202 (i.e., t<L), it is possible to effect the electrolytic etching when a relationship: 5 t≧L is satisfied. In this instance, however, an edge portion of the etching pattern becomes ununiform to provide a partially wider etching region and the etching width is also increased with an increased gap. In order to provide a desired gap between the electrode 100 and the etching object 202, it is possible to use a movable electrode, thus precisely controlling a vertical positioning of the electrode.

When a substrate with a relatively low surface planarity (relative high surface roughness) is used as the etching object 202, a gap-regulating member comprising, e.g., polytetrafluoroethylene, polyethylene terephthalate (PET) or polyester may preferably be used for effectively etching such a substrate. For instance, a plurality of the gap-regulating members each having a certain height are disposed so as to enclose (surround) the etching region, thus providing a certain gap (distance) between the substrate and the electrode.

In the present invention, the width of the first electrode 101 may be determined depending on the width of each insulating member 102 and the etching width.

As apparent from Table 1 shown below, in the case where the entire width of one insulating member 102/first electrode 101/the other insulating member 102 (corresponding to the distance between the second electrodes 103) is set to be a certain value, it is possible to obtain a constant etching width even when the widths of each insulating member 102 and the first electrode 101 are changed, respectively.

TABLE 1

| Width of each insulating member (mm) | Width of first electrode (mm) | Entire width (mm) | Etching width (mm) |
| --- | --- | --- | --- |
| 0.1 | 1.0 | 1.2 | 1.4 ± 0.1 |
| 0.2 | 0.8 | 1.2 | 1.4 ± 0.1 |
| 0.5 | 0.2 | 1.2 | 1.4 ± 0.1 |
| 0.2 | 1.0 | 1.4 | 1.6 ± 0.1 |
| 0.4 | 0.6 | 1.4 | 1.6 ± 0.1 |
| 0.6 | 0.2 | 1.4 | 1.6 ± 0.1 |

In this case, the entire width (of one insulating member 102/first electrode 101/the other insulating member 102) may preferably be designed to be smaller in order to form a finer etching pattern. For this purpose, the distance between the first electrode 101 and each second electrode 103 (the width of each insulating member 102) may preferably be set to be a smaller value, more preferably 0.05–2.0 mm.

Further, as apparent from Table 2 shown below, in the case where a certain entire width is employed similarly as in the case of Table 1, it is possible to obtain a constant etching width even when the width of each second electrode 103 is changed.

TABLE 2

| Width of each second electrode (mm) | Entire width (mm) | Etching width (mm) |
| --- | --- | --- |
| 1 | 1.2 | 1.4 ± 0.1 |
| 3 | 1.2 | 1.4 ± 0.1 |
| 5 | 1.2 | 1.4 ± 0.1 |
| 8 | 1.2 | 1.4 ± 0.1 |
| 10 | 1.2 | 1.4 ± 0.1 |
| 20 | 1.2 | 1.4 ± 0.1 |

The values of the etching widths shown in Tables 1 and 2 are based on measured values through observation with an optical microscope (magnification=10–100 (e.g., 20)). Further, the data shown in Tables 1 and 2 are based on values measured under the condition that the gap ("L") between the electrode structure 100 and the etching object 202 is set to be a certain value.

As described above, in the electrolytic etching using the electrode structure according to the above-mentioned embodiment, the control of the etching width can readily be performed by appropriately designing the electrode structure 100 based on the constant entire width ("T") of the first electrode 101 and the insulating members 102 (the distance between the second electrodes 103). Further, by appropriately controlling the current amount and the electrolytic etching time, it becomes possible to provide a uniform and sharper etching line. For example, in the case of using a DC, by determining the current value, it is possible to obtain an etching line having a desired width based on a proportional relationship between the etching width and the current application time. In the case where a pulse current is employed, a desired etching line can be obtained by appropriately controlling the number of pulse application.

Hereinbelow, some embodiments of the formation of a more complicated etching pattern will be described with reference to FIGS. 4–7.

Figure 4A:
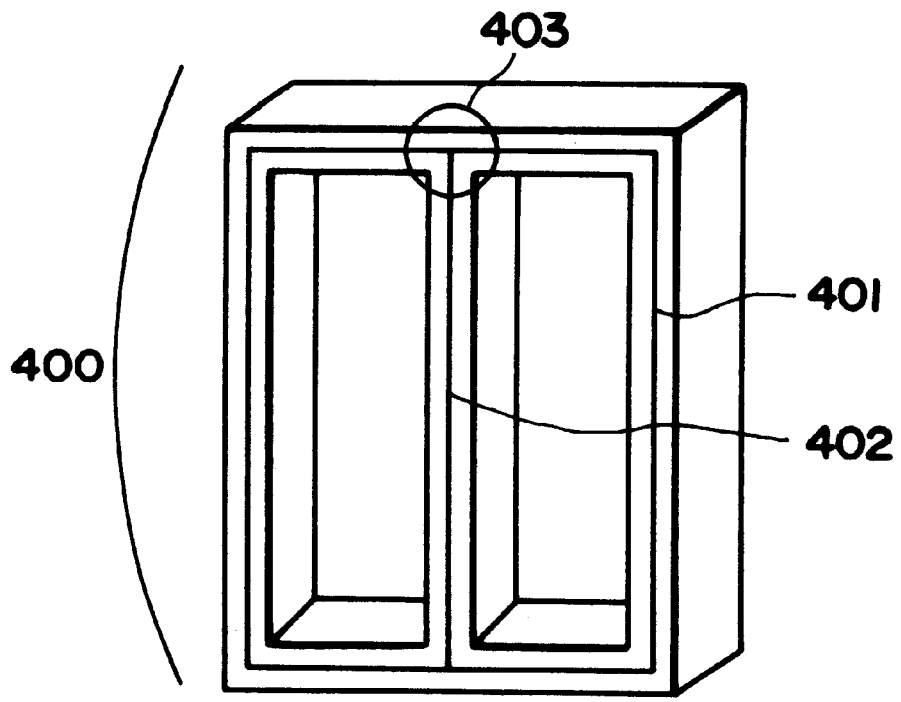
FIG. 4A is a schematic perspective view showing another embodiment of the electrode according to the present invention and FIG. 4B is a partially enlarged view thereof.
Figure 4B:
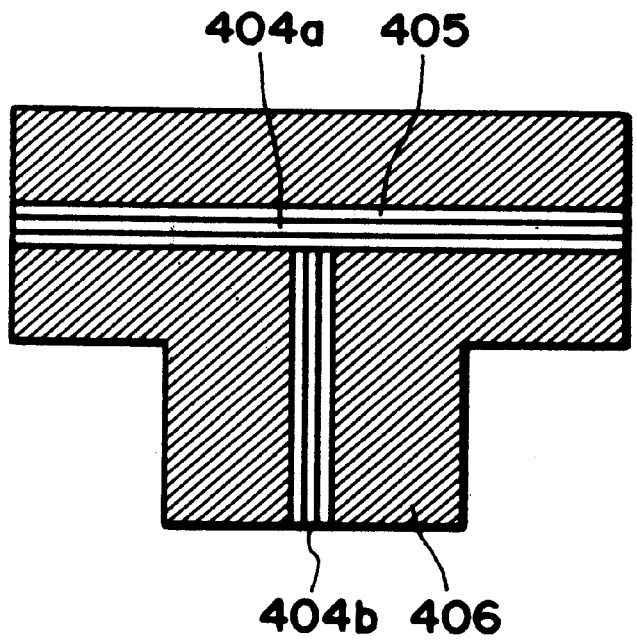

FIG. 4A is a schematic perspective view of another embodiment of the electrode structure according to the present invention and FIG. 4B is a partially enlarged view of a part of the electrode shown in FIG. 4A.

Referring to FIG. 4A, an electrode structure 400 includes a rectangular frame portion (surrounding portion) 401 and an elongated central portion 402 and corresponds to a modified electrode of the electrode structure 100 described above.

Referring to FIG. 4B, a part 403 of the electrode structure 400 shown in FIG. 4A includes first electrode 404a and 404b, insulating members 405 and second electrodes 406.

In the electrode structure 400 of this embodiment, the first electrode 404a of the surrounding portion 401 and the first electrode 404b of the central portion 402 are electrically insulated (isolated) from each other and accordingly can independently be connected with an electric wire, respectively. The first electrodes 404a and 404b may be supplied with a current at the same time.

In this embodiment, an constituent electrode structure having the similar structure (consisting of one first electrode, two insulating members and two second electrodes) as in the electrode 100 (as shown in FIG. 1A) corresponds to one side of the rectangular-shaped surrounding portion 401 or the elongated central portion 402 (hereinafter, such a constituent electrode structure is referred to as "composite electrode structure"). In other words, the electrode structure 400 of this embodiment is constituted by five composite electrode structure in combination so that each of four composite electrode structures form one side of the rectangular shape of the surrounding portion 401 and the remaining one composite electrode structure forms the central portion 402 dividing an inner region of the surrounding portion 401 into two regions (e.g., two equal regions).

Figure 5A:
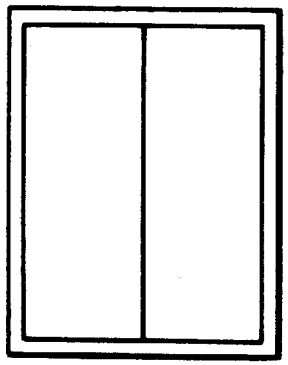
FIGS. 5A–5C are respectively an example of an etching pattern obtained through etching with the electrode shown in FIG. 4A.
Figure 5B:
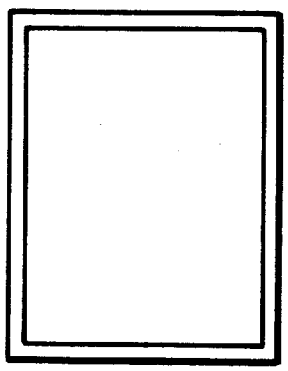
Figure 5C:
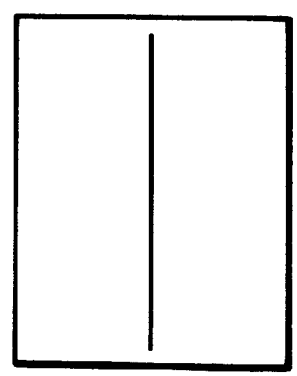

FIGS. 5A–5C are schematic plan views each showing an etching pattern obtained by performing the electrolytic etching with the electrode structure 400.

When the first electrodes 404a and 404b (of the surrounding portion 401 and the central portion 402, respectively) are supplied with a current at the same time, the electrode structure 400 provides an etching pattern as shown in FIG. 5A. Further, an etching pattern as shown in FIG. 5B is obtained by supplying a current to only the first electrode 404a of the surrounding portion 401, and an etching pattern as shown in FIG. 5C is obtained by supplying a current to only the first electrode 404b of the central portion 402.

In order to electrically insulating the first electrode 404a of the surrounding portion 401 from the first electrode 404b of the central portion 402, an insulating means is required to e provided between the first electrode 404a and 404b at a T-shaped connecting part 403 as shown in FIG. 4B. Examples of the insulating means may include the insulating member as described above an a gap (empty space).

In the case where the width of the insulating means at the T-shaped connecting part becomes too large (i.e., the distance between the first electrodes 404a and 404b is too large), an etching-failure portion (where etching cannot be effected) occurs at the T-shaped connecting part even when the current is supplied to the first electrodes 404a and 404b (of the surrounding portion 401 and the central portion 402, respectively) (hereinafter, such a phenomenon is referred to as "etching failure (or breakage of etching line)").

In this embodiment, the width of the insulating means may preferably be set to be 0.1–0.3 mm in order to prevent the etching failure.

FIG. 6A is a schematic perspective view of another embodiment of the electrode structure of the present invention wherein an electrode structure 600 includes a rectangular surrounding (frame) portion 601 and a crossed central portion 602. FIG. 6B is a partially enlarged view of a part 603a (T-shaped connecting part) of the surrounding portion 601 and FIG. 6C is a partially enlarged view of a part (cross-shaped part) 603b of the central portion 602.

Referring to FIG. 6A, the electrode structure 600 is constituted by four composite electrode structures forming the rectangular surrounding portion 601 and two composite electrode structures forming the crossed central portion 602, thus dividing an inner region of the surrounding portion 601 into four regions (e.g., four equal regions) by the central portion 602.

The T-shaped connecting part 603a shown in FIG. 6B has the same structure as that (403) of the electrode structure 400 shown in FIG. 4B. The members 604a, 604b, 605 and 606 (FIG. 6B) correspond to the members 404a, 404b, 405 and 406 (FIG. 4B), respectively.

The cross-shaped part 603b shown in FIG. 6C includes four first electrodes 604b each electrically insulated (isolated) and separated from a first electrode 604c located at the center of the cross-shaped part 603b. The electrical insulation may be performed in a similar manner as in the above-described embodiment of FIGS. 4A and 4B.

In this embodiment, the perspective first electrodes 604a, 604b and 604c are mutually electrically isolated and thus can be supplied with a current separately or at the same time.

Figure 7A:
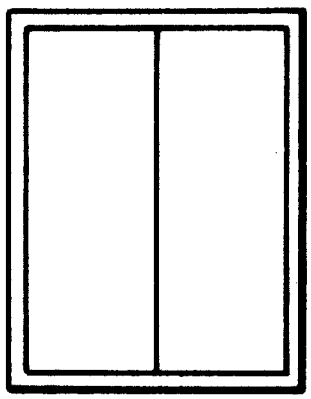
FIGS. 7A and 7B are respectively an example of an etching pattern obtained through etching with the electrode shown in FIG. 6A.
Figure 7B:
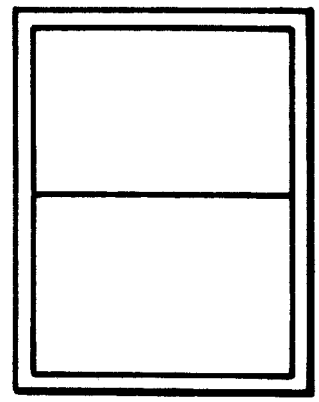

FIGS. 7A and 7B are schematic plan views each showing an etching pattern obtained by effecting the electrolytic etching with the electrode structure 600. More specifically, e.g., the etching pattern shown in FIG. 7A can be obtained by supplying a current at the same time to the entire first electrodes 604a, 604b and 604c except for two first electrodes 604b extending in a horizontal (right-and-left) direction in FIG. 6C and the etching pattern shown in FIG. 7B can be obtained by supplying a current at the same time to the entire first electrodes 604a, 604b and 604c except for two first electrodes 604b extending in a vertical (up-and-down) direction in FIG. 6C.

In the present invention, the first electrodes may be divided further finely and the arrangement of the respective (composite) electrode structures may be made complicate depending on a desired etching pattern. Further, with respect to each (composite) electrode structure, the shapes and thicknesses of the respective portions or members for the insulating member(s) and/or the second electrode(s) may independently be modified appropriately, thus providing a symmetrical or asymmetrical structure based on the first electrode in view of various etching patterns.

In the case where the electrolytic reaction in the electrolytic etching is accompanied with generation of gas (bubbles), it is required to control the electrolysis time and/or to remove the bubbles. Such bubbles resulting from the gas generation are liable to be held at the surface of the electrode structure of the present invention. At a portion where the bubbles are held, an ordinary etching reaction cannot be effected, thus being liable to cause etching failure.

In order to remove such bubbles, it is possible to effect a forced circulation of the electrolytic solution between the electrode structure and the etching object.

In the present invention, in order to further ensure the removal of the bubbles, the electrode structure may be provided with a wiping means in a prescribed position not adversely affecting the electrolytic reaction. The wiping means may be moved along the surface of the electrode structure.

Figure 8A:
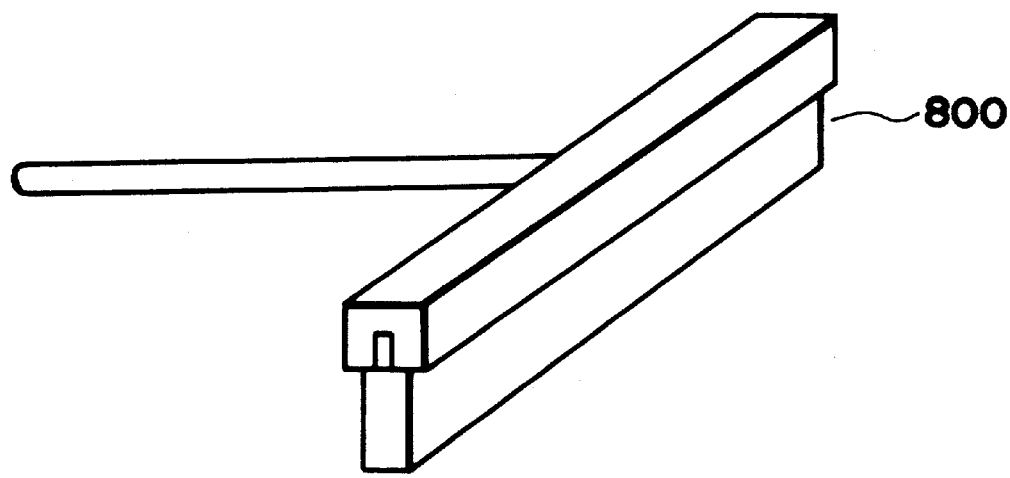
FIG. 8A is a schematic perspective view showing an embodiment of a wiping means used in the present invention and FIG. 8B is a schematic side (lateral) view of another embodiment of a wiping means used in the present invention.
Figure 8B:
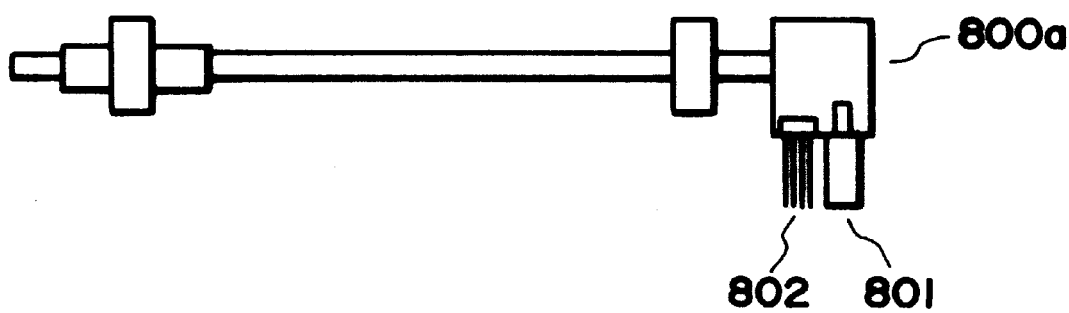

FIGS. 8A and 8B are respectively an embodiment of a wiper 800 (or 800a) as the wiping means.

The wiper 800 shown in FIG. 8A include a member contactable to the electrode structure surface. Such a member may include a sponge or foamed member of a resin, such as urethane resin, silicone resin, ethylene-propylene-diene-terpolymer (EPDM) and ethylene-propylene copolymer (EPM); a rubber member; and a brush member.

The wiper 800a shown in FIG. 8B include a sponge member or rubber member 801 and a brush member 802 in combination, thus further enhancing a bubble-removal effect.

The wiping means used in the present invention may be an ultrasonic wave-generating means by which ultrasonic vibrations are excited within the electrolysis solution, thus removing the bubbles.

Hereinbelow, the present invention will be described more specifically based on Examples.

EXAMPLE 1

Patterning of a transparent electroconductive film was performed by electrolytic etching using an electrode structure 100 as shown in FIG. 1B (1A) and an electrolytic etching apparatus 200 as shown in FIG. 2.

The electrode structure 100 comprised a plate-shaped first electrode 101 of Pt (100×50×0.8 mm), two plate-shaped insulating members 102 of glass-epoxy resin (100×45×0.2 mm) and two plate-shaped second electrodes 103 of stainless steel (SUS 304) (100×40×2 mm).

The first electrode 101 was sandwiched between the above two insulating members 102 and further sandwiched between the above two second electrodes 103 to prepare the electrode structure 100, which was then fastened together by a fastening means (not shown in FIGS. 1B and 2) so as to provide an exposed etching surface (closest to the surface of an etching object 202 in the electrolytic etching apparatus). The etching surface was polished to provide a flattened (smooth) surface.

Separately, an etching object 202 was prepared by depositing a 750 Å-thick ITO (indium-tin oxide) film on a plate-shaped substrate of stainless steel (SUS 304) (150×50×0.5 $\mu$m) preliminarily degreased and washed sufficiently.

Then, the thus prepared electrode structure 100 and etching object 202 were set in the electrolytic etching apparatus 200 (as shown in FIG. 2). The surface of the ITO film of the etching object 202 and the flattened exposed surface of the electrode structure 100 were disposed opposite to each other with a gap therebetween of 0.2 mm by using two spacing members (2×2×0.4 mm) made of polyethylene terephthalate.

The first electrode 101 of the electrode structure 100 was electrically with a direct-current (DC) power supply 205 so as to constitute an anode, and the second electrodes 103 of the electrode structure 100 and the SUS 304 substrate of the etching object 202 were electrically connected with the power supply 205 (as shown in FIG. 2) so as to constitute a cathode.

As an electrolysis solution 203, a 8 wt. %-aqueous solution of aluminum chloride hydrate showing an electrical conductivity of 65 mS/cm was used.

The electrolytic etching treatment was performed by supplying a constant current (DC; 0.2 A) for 0.2 sec. Similarly, the electrolytic etching treatment was repeated with respect to 100 etching objects 202 in total.

After the treatment, each of the etching objects 202 was taken out from the elctrolysis solution 203 and washed with pure water, followed by observation with pure water, followed by observation with an optical microscope to obtain an etching line (pattern) consisting of an average length of 100 mm±0.2 mm and an average width of 1.4 mm±0.2 mm. Further, peeling and scar of the ITO film surface other than the etching line were not observed.

COMPARATIVE EXAMPLE 1

Figure 10:
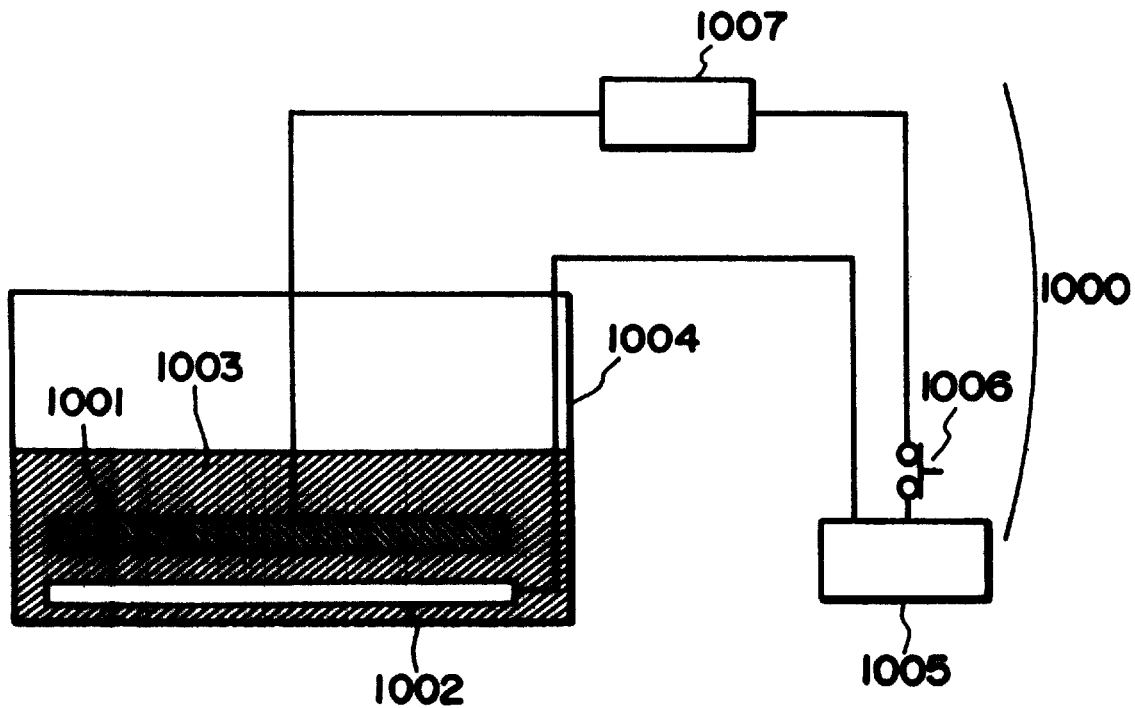
FIG. 10 is a schematic illustration of a conventional electrolytic etching apparatus.

Patterning of a transparent electroconductive film was performed by electrolytic etching in a conventional manner using a photoresist formed on an etching object 1002 and a conventional electrolytic etching apparatus 1000 as shown in FIG. 10.

100 etching objects 1002 were prepared in the same manner as in the etching objects 202 of Example 1.

Each of the etching objects 1002 was coated with a photoresist layer and dried. On the photoresist layer, a photomask with a pattern of 100 mm in length and 1.4 mm in width was superposed, followed by ultraviolet (UV) ray-irradiation and a treatment with chemicals to provide a corresponding resist pattern.

Each of the thus-treated etching objects 2002 and a plate-shaped counter electrode 1001 of stainless steel (SUS 304) (100×50×1 mm) were set in the electrolytic etching apparatus 1000 and were subjected to the electrolytic etching treatment under the same electrolytic etching conditions (including the electrolysis solution used) as in Example 1.

After the treatment, each of the etching objects 1002 was taken out from the electrolysis solution 1003 and subjected to removal of the photoresist layer with alcohol, followed by washing, drying and observation with an optical microscope in the same manner as in Example 1.

As a result of the microscope observation, the above-treated 100 etching objects 1002 included 8 etching objects each accomplished with a partial breakage (etching failure) of the etching pattern. This may be attributable to an insufficient removal of the photoresist film during the patterning with UV rays.

Further, 10 etching objects 1002 were found to provide an ununiform etching line (pattern). This may be because adhesiveness properties between the photoresist film and the ITO film (transparent electroconductive film) become insufficient and the plate-shaped counter electrode 1001 has no pattern corresponding to the etching pattern, thus failing to control electric line of force generated between the counter electrode 1001 and the etching object 1002 thereby to cause side etching and over etching.

Further, a partial peeling of the ITO film was observed at a portion other than the etching line with respect to 5 etching objects 1002.

EXAMPLE 2

Patterning of a transparent electroconductive film by electrolytic etching was performed in the same manner as in Example 1 with respect to 100 etching objects 202 except that the applied current (DC) supplied from the DC power supply 205 was changed to a pulse current (supplied from a pulse power supply 205).

More specifically, the pulse current (0.05 A; pulse width=0.2 sec.; interval=0.1 sec.) was repetitively applied twenty times.

When the etching objects 202 were observed with an optical microscope in the same manner as in Example 1, the etching objects 202 provided an average etching line of 100 mm±0.1 mm in length and 1.4 mm±0.1 mm in width, thus obtaining a sharp etching line compared with that of Example 1.

Further, all the etching objects 202 were not accompanied with peeling and scar of the ITO film surface here the etching line was formed.

EXAMPLE 3

Figure 9:
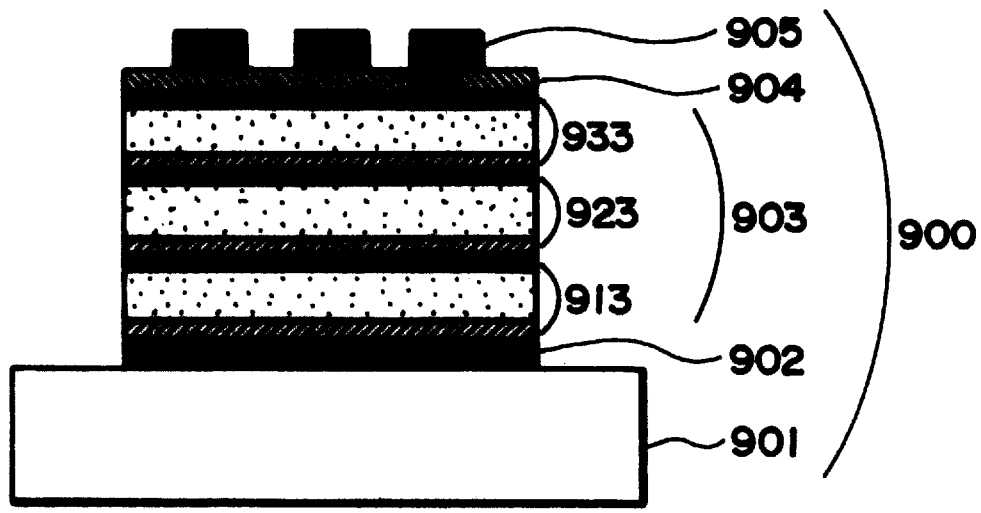
FIG. 9 is a schematic sectional view of an embodiment of a solar cell produced through the production process of a photoelectricity generating device according to the present invention.

An amorphous solar cell having a pin conjunction-type triple cell structure as shown in FIG. 9 was prepared by using a transparent conductive film etched for patterning by using an electrolytic etching electrode structure as shown in FIGS. 4A and 4B and an electrolytic etching apparatus as shown in FIG. 2.

A 0.15 mm-thick rolled sheet of stainless steel (SUS 430BA)(width=360 mm) for a substrate 901 was sufficiently washed by ultrasonic cleaning with acetone and isopropyl alcohol and was placed in a DC magnetron sputtering apparatus.

On the surface of the sheet (substrate 901), a 0.4 $\mu$m-thick Ag layer was deposited at room temperature and thereon a 0.4 $\mu$m-thick ZnO layer was deposited at 350° C. (substrate temperature), thus forming a two-layer lower electrode 902.

After the sheet was taken out from the sputtering apparatus, a semiconductor layer 903 consisting of a bottom cell 913, a middle cell 923 and a top cell 933 was successively formed on the lower electrode 902 each by forming an n-type semiconductor layer, an i-type semiconductor layer and a p-type semiconductor layer in this order, respectively.

A deposition chamber (vacuum chamber) was reduced in pressure so as to provide a prescribed inner pressure. In the deposition chamber, an $SiH_4$—$H_2$ mixture gas was introduced while controlling a substrate temperature by a heater, followed by evacuation by using a vacuum pump. A $BF_3$ gas was used as a dopant gas for the p-type semiconductor layer and a $PH_3$ gas was used as a dopant gas for the n-type semiconductor layer. In this example, it is possible to use other dopant gases for the p-type and n-type semiconductor layers, respectively.

At the deposition of the i-type semiconductor layer, microwaves generated by a microwave generator (device) were guided in the deposition chamber through a waveguide and an alumina-made waveguide window under conditions including a substrate temperature of 350° C., an inner pressure of 1 Torr, a microwave power of 0.01 W/cm$^3$ and a microwave frequency of 2.45 GHz.

A the deposition of the p-type semiconductor layer and the n-type semiconductor layer, a high-frequency (radio-frequency) was supplied from a high-frequency power supply to the deposition chamber under conditions including a substrate temperature of 200° C., an inner pressure of 1 Torr, a RF power of 0.01 W/cm$^3$ and a frequency of 13.45 MHz.

The thus prepared bottom cell 913 comprised a 250 Å-thick n-type semiconductor layer, a 1050 Å-thick i-type semiconductor layer and a 100 Å-thick p-type semiconductor layer. The middle cell 923 comprised a 600 Å-thick n-type semiconductor layer, a 1450 Å-thick i-type semiconductor layer and a 100 Å-thick p-type semiconductor layer. The top cell 933 comprised a 100 Å-thick n-type semiconductor layer, a 1000 Å-thick i-type semiconductor layer and a 100 Å-thick p-type semiconductor layer.

On the thus prepared semiconductor layer 903, a 730 Å-thick ITO (indium-tin-oxide) film as a transparent electroconductive film 904 having a reflection-prevention function was formed at 170° C. by using a DC magnetron sputtering process, thus preparing a solar cell plate.

The solar cell plate was cut into plates each having a size of 360×260 mm, which was used as an etching object and subjected to patterning of the ITO film 904 in the same manner as in Example 1 by using an electrode structure 400 for electrolytic etching shown in FIG. 4A and an electrolytic etching apparatus 200 shown in FIG. 2.

The electrode structure 400 were prepared by using plate-shaped first electrodes 404a and 404b of Pt (100×50×0.8 mm), plate-shaped insulating members 405 of glass-epoxy resin (100×45×0.2 mm) and plate-shaped second electrodes 406 of SUS304 stainless steel (100×40×2.0mm) in combination so as to provide an electrode structure 400 having an outer size of 350×250 mm, which was polished to form a flat (smooth) surface as an exposed etching surface. The first electrodes 404a for a surrounding portion 401 (of the electrode structure 400) and the first electrodes 404b for a central portion 402 were separately electrically connected so as to independently effect a current flow.

The electrode structure 400 was electrically connected with a DC power supply 205 so that the first electrodes 404a and 404b constituted an anode and the second electrodes 406 and the ITO film 904 of the etching object (solar cell) constituted a cathode.

An electrolysis solution 203 used was the same as that used in Example 1 (aluminum chloride hydrate; an electrical conductivity=65 mS/cm), and the gap between the electrode structure 400 and the ITO film 904 of the etching object (solar cell plate) was set to 0.2 mm similarly as in Example 1. Further, at the gap portion, the electrolysis solution 203 was circulated.

The electrolytic etching treatment was performed by supplying a constant current (DC; 22 A) for 0.3 sec. to the electrode members except for the first electrodes 404b (i.e., only the first electrodes 404a for the surrounding portion were supplied with the current with respect to the first electrodes 404a and 404b) so as to provide an etching pattern shown in FIG. 5B, followed by washing with pure water.

On the thus treated solar cell plate, a collector grid electrode 905 was formed in a pitch of 5 mm by coating a conductor wire with carbon paste, followed by thermocompression (heat and pressure) bonding at 200° C. for 1 min. to prepare a solar cell 900 as shown in FIG. 9.

In a similar manner, 100 solar cell 900 (in total) were prepared and then were subjected to evaluation of initial solar cell characteristics in the following manner.

First, in a dark state, a current-voltage (I-V) characteristic was measured to obtain an average shunt (leakage) resistance of 200 kΩ.cm$^2$ from a slope in the vicinity of origin of the I-V curve, and no shunt was caused.

Then, when a photoelectric conversion efficiency was determined based on values measured by using a solar simulator (mfd. by SPIRE Co.) providing a light (luminous) intensity of 100 mV/cm$^2$ at a prescribed solar spectrum (air mass (AM)=1.5), a photoelectric conversion efficiency of 9.0%±0.2% was obtained.

When the etching pattern formed on the ITO film 904 was observed through an optical microscope, a uniform etching line free from no breakage of the film and etching failure was confirmed.

Each of these solar cells 900 was formulated in a solar cell module in the following manner.

On a galvalume steel sheet; an insulating film both sides of which were coated with an ethylene vinyl acetate (EVA) resin layer, a nonwoven fabric of glass layer, the solar cell 900, an EVA resin sheet, and a fluorine-containing resin film were superposed in this order, followed by heat-pressure bonding by using a lamination apparatus, thus preparing a laminate solar cell module.

The thus prepared solar cell module was subjected to a reliability test based on a temperature and humidity cycle test A-2 prescribed in an environmental testing method and a durability testing method for a crystalline solar cell module according to JIS (Japan Industrial Standards) C8917.

The solar cell module was placed in a constant temperature and humidity device capable of controlling a temperature and a relative humidity and was subjected to 20 cycles of the cycle test between a lower temperature of −40° C. and an upper temperature of 85° C.

After the cycle test, the solar cell module was subjected to measurement of the photoelectric conversion efficiency in the same manner as in the initial stage described above, whereby an average photoelectric conversion efficiency which was 98.0% of that at the initial stage.

As described above, according to this example, it is possible to improve a patterning accuracy in the electrolytic etching and provide a solar cell (module) excellent in initial characteristics and a reliability. Further, the patterning of the ITO film can be performed in a short period of time since no additional steps (e.g., application and removal of the photoresist) before and after the electrolytic etching treatment were required as in the conventional process.

EXAMPLE 4

An amorphous solar cell was prepared in the same manner as in Example 3 except that the electrolytic etching treatment was performed by supplying a constant current (DC; 25 A) for 0.3 sec. to the entire electrode members including the first electrodes 404b (for the central portion 402 of the electrode structure 400) not supplied with the current in Example 3 so as to provide an etching pattern as shown in FIG. 5A wherein an ITO film region of an etching object was divided into two regions.

Thereafter, a collector grid electrode 905 was formed on the ITO film in the above two regions in the same manner as in Example 1, thus preparing 100 solar cells 900 in total.

These solar cells 900 were evaluated in the same manner as in Example 3 to provide initial characteristic including an average shunt resistance of 200 k$\Omega$.cm$^2$, no occurrence of a shunt current, and a photoelectric conversion efficiency of 9.2%±0.5%. The initial characteristics were not substantially changed with respect to the above-mentioned two region of the ITO film.

Each of the solar cells 900 was formulated in a laminate solar cell module and evaluated in the same manner as in Example 3, whereby an average photoelectric conversion efficiency was 97.9% of that at the initial stage.

As described above, the electrolytic etching process of the present invention can be used for effecting a complicated patterning of the transparent electroconductive film (ITO film). Further, according to this example, it is possible to attain the same advantageous effects as in Example 3.

EXAMPLE 5

In order to confirm a stability of an etching operation for a long period of time, patterning of a transparent electroconductive film was performed in a ten-second cycle of immersion-etching-recovery in the same manner as in Example 1 with respect to 30,000 samples in total.

In this example, in order to remove bubbles generated during the electrolytic etching, the following methods (A), (B) and (C) were adopted each for 10,000 samples, respectively.

Method (A)

A wiper of polytetrafluoroethylene was moved at a speed of 100 cm/min. along the exposed etching surface of the electrode structure.

Method (B)

Ultrasonic vibration (50 kHz) was applied at the exposed etching surface where the electrode structure contacted with the electrolysis solution.

Method (C)

Methods (A) and (B) were applied at the same time.

As a result of observation through an optical microscope performed in the same manner as in Example 1, good etching patterns for 30,000 samples were confirmed in the patterning processes using the above methods (A), (B) and (C), respectively. Further, after effecting the respective patternings of 10000 times, all the widths of the etching lines were found to be stable (1.4 mm±0.2 mm).

EXAMPLE 6

Patterning of a thin aluminum film was performed by electrolytic etching using an electrode structure 100 as shown in FIG. 1B and an electrolytic etching apparatus 200 as shown in FIG. 2 in the same manner as in Example 1 except that the etching object and the electrolytic etching conditions were changed as follows.

An etching object 202 was prepared by depositing a 1 $\mu$m-thick Al layer on a 1 mm-thick glass substrate (preliminarily degreased and washed sufficiently) by using a vapor deposition apparatus.

The electrolytic etching was performed by supplying a constant current (DC; 7 A) for 0.3 sec. within an electrolysis solution 203 of a mixture solution of phosphoric acid and nitric acid (electric conductivity=50 mS/cm) under the condition that the first electrode 101 was used as a cathode and the second electrode 103 and the Al film were used as an anode.

As a result of observation through an optical microscope performed in the same manner as in Example 1, a good etching pattern was attained.

EXAMPLE 7

Patterning of a copper sheet (foil) was performed by electrolytic etching using an electrode structure 100 as shown in FIG. 1B and an electrolytic etching apparatus 200 as shown in FIG. 2 in the same manner as in Example 1 except that the etching object was changed to a 0.2 mm-thick copper sheet and the electrolytic etching conditions were changed as follows.

The electrolytic etching was performed by supplying a constant current (DC; 7 A) for 0.3 sec. under the condition that the first electrode 101 was used as a cathode and the second electrode 103 and the copper sheet were used as an anode.

As a result of observation through an optical microscope performed in the same manner as in Example 1, the resultant etching lien (pattern) had a width of 0.5 mm±0.1 mm. Further, when the depth of the etching line was measured by using a surface roughness meter ("ALPHA-STEP 200", mfd. by TENCOR INSTRUMENTS Co.), the etching line was found to form a 1.0 $\mu$m-deep linear groove portion.

As described hereinabove, according to the present invention, it is possible to remarkably simplify the electrolytic etching process and effect patterning of the etching object with an excellent selectivity and less damage on a region and layer which are not subjected to the electrolytic etching.

Further, it is also possible to provide a photo-electricity generating device showing good photoelectric characteristics and having solved problems, such as an occurrence of shunt and surface defects.

What is claimed is:

1. An electrode structure, comprising:

a first electrode, and at least one second electrode providing a pair of opposite portions with a prescribed spacing therebetween at which the first electrode is disposed, said electrode structure being provided in a plurality of electrode structures disposed to form a rectangular surrounding portion and a central portion, wherein the first electrode is adapted to have a polarity different from that of said at least one second electrode.

2. A structure according to claim 1, wherein said at least one second electrode is disposed so as to surround the first electrode.

3. A structure according to claim 1, wherein the first electrode and said at least one second electrode provide a prescribed distance therebetween.

4. A structure according to claim 3, wherein said prescribed distance is 0.05–2.0 mm.

5. A structure according to claim 1, wherein the first electrode and said at least one second electrode provide an electrically insulating spacing therebetween.

6. A structure according to claim 5, wherein said electrically insulating spacing comprises an insulating member.

7. A structure according to claim 6, wherein said insulating member comprises a resin selected from the group consisting of epoxy resin, phenolic resin and silicone resin.

8. A structure according to claim 1, wherein the first electrode and said at least one second electrode provide an empty space therebetween.

9. A structure according to any one of claims 1–7, wherein each of the first electrode and said at least one second electrode comprises a plate-shaped conductor.

10. A structure according to claim 1, wherein the first electrode comprises a material selected from the group consisting of Pt, Au, C and alloys thereof.

11. A structure according to claim 1, wherein the first electrode has at least one exposed surface and said at least one second electrode has at least one exposed surface, said exposed surfaces being substantially in a common plane.

12. A structure according to claim 11, wherein the first electrode and said at least one second electrode provide a spacing therebetween comprising an insulating member, said insulating member having at least one exposed surface substantially in said common plane.

13. A structure according to claim 1, wherein said rectangular surrounding portion comprises four electrode structures and said central portion comprises one electrode structure dividing a spacing in the surrounding portion into two regions.

14. A structure according to claim 1, wherein said rectangular surrounding portion comprises four electrode structures and said central portion comprises two electrode structures crossing each other so as to divide a spacing in the surrounding portion into four regions.

15. A structure according to claim 1, wherein said plurality of electrode structures include plural first electrodes which are partially electrically isolated from each other.

16. A structure according to claim 1, wherein said rectangular surrounding portion comprises plural electrode structures including plural first electrodes which are electrically isolated from first and second electrodes contained in the central portion.

17. A structure according to claim 1, wherein said electrode structure has at least a portion which is adapted for immersion in an electrolytic solution for electrolytic etching.

18. A structure according to claim 17, wherein the first electrode comprises an electrode for dissolving at least a part of an etching object by an electrochemical reaction, and said at least one second electrode comprises at least one electrode for regulating an etching region.

19. A structure according to claim 17, wherein the first electrode has an exposed surface having a pattern corresponding to that of a region to be etched on the etching object.

20. An electrolytic etching process, comprising:

immersing an electrode structure and an etching object providing a gap therebetween in an electrolytic solution, and supplying a current passing through the gap to dissolve at least a part of the etching object, wherein said electrode structure comprises a first electrode, and at least one second electrode providing a pair of opposite portions with a prescribed spacing therebetween at which the first electrode is disposed.

21. A process according to claim 20, wherein said current comprises a direct current, a pulse current or an alternating current.

22. A process according to claim 20, wherein said electrolytic solution comprises Lewis acid, Lewis base, a solution containing Lewis acid or a solution containing Lewis base.

23. A process according to claim 20, further comprising a step of removing a bubble held at a surface of said electrode structure by wiping means.

24. A process according to claim 20, further comprising a step of removing a bubble held at a surface of said electrode structure by using a ultrasonic wave.

25. A process according to claim 20, wherein said etching object has a transparent electroconductive film.

26. A process according to claim 20, wherein said etching object comprises a photo-electricity generating device having a metal layer and/or a transparent electroconductive film.

27. An electrolytic etching apparatus, comprising:

an electrode structure comprising a first electrode, and at least one second electrode providing a pair of opposite portions with a prescribed spacing therebetween at which the first electrode is disposed;

an etching object adapted for immersion together with said electrode structure in an electrolytic solution while leaving a gap with said electrode structure; and means for supplying a current passing through the gap to dissolve at least a part of the etching object.

28. An apparatus according to claim 27, wherein said electrode structure comprises an insulating member disposed between the first electrode and said at least one second electrode.

29. An apparatus according to claim 28, wherein said insulating member has an electrical conductivity of at most $\frac{1}{10}$ of that of said electrolytic solution.

30. An apparatus according to claim 27, wherein each of the first electrode and said at least one second electrode comprises a plate-shaped conductor.

31. An apparatus according to claim 27, wherein said at least one second electrode is disposed so as to surround the first electrode.

32. An apparatus according to claim 27, wherein the first electrode has a polarity different from that of said at least one second electrode.

33. An apparatus according to claim 27, wherein the first electrode has at least one exposed surface and said at least one second electrode has at least one exposed surface, said exposed surfaces being substantially in a common plane.

34. An apparatus according to claim 33, wherein the first electrode and said at least one second electrode provide a spacing therebetween comprising an insulating member, said insulating member having at least one exposed surface substantially in said common plane.

35. An apparatus according to claim 27, wherein said electrode structure is provided in a plurality of electrode structures.

36. An apparatus according to claim 35, wherein said plurality of electrode structures are disposed so as to form a rectangular surrounding portion and a central portion.

37. An apparatus according to claim 36, wherein said rectangular surrounding portion comprises four electrode structures and said central portion comprises one electrode structure dividing a spacing in the surrounding portion into two regions.

38. An apparatus according to claim 36, wherein said rectangular surrounding portion comprises four electrode structures and said central portion comprises two electrode structures crossing each other so as to divide a spacing in the surrounding portion into four regions.

39. An apparatus according to claim 36, wherein said rectangular surrounding portion comprises plural electrode structures including plural first electrodes which are electrically isolated from first and second electrodes contained in the central portion.

40. An apparatus according to claim 35, wherein said plurality of electrode structures include plural first electrodes which are partially electrically isolated from each other.

41. An apparatus according to claim 27, wherein said current comprises a direct current, a pulse current or an alternating current.

42. An apparatus according to claim 27, further comprising wiping means for removing a bubble held at a surface of said electrode structure.

43. An apparatus according to claim 27, further comprising ultrasonic wave-generating means for removing a bubble held at a surface of said electrode structure.

44. An apparatus according to claim 27, wherein the first electrode comprises an electrode for dissolving at least a part of an etching object by an electrochemical reaction, and said at least one second electrode comprises at least one electrode for regulating an etching region.

45. An apparatus according to claim 27, wherein the first electrode has an exposed surface having a pattern corresponding to that of a region to be etched on the etching object.

46. An apparatus according to claim 27, wherein the first electrode and said at least one second electrode provide a distance satisfying a prescribed relationship with said gap between the electrode structure and the etching object so as to control an etching region.

47. An apparatus according to claim 46, wherein said gap is at most five times said distance.

48. An apparatus according to claim 27, wherein said electrolytic solution comprises Lewis acid, Lewis base, a solution containing Lewis acid or a solution containing Lewis base.

49. A process for producing a photoelectricity generating device, comprising:

immersing an electrode structure and an etching object providing a gap therebetween in an electrolytic solution, said etching object comprising at least a semiconductor layer and an electroconductive surface layer, and supplying a current passing through the gap to dissolve at least a part of the electroconductive surface layer of the etching object to effect a patterning of the electroconductive surface layer, wherein said electrode structure comprises a first electrode, and at least one second electrode providing a pair of opposite portions with a prescribed spacing therebetween at which the first electrode is disposed.

* * * * *

UNITED STATES PATENT AND TRADEMARK OFFICE
CERTIFICATE OF CORRECTION

PATENT NO. : 5,993,637
DATED : November 30, 1999
INVENTOR(S) : MASAYA HISAMATSU ET AL.

It is certified that error appears in the above-identified patent and that said Letters Patent is hereby corrected as shown below:

COLUMN 1:

Line 29, "(pattaern" should read --(pattern--.

COLUMN 2:

Line 4, "lowing" should read --lowering--.

COLUMN 4:

Line 40, "performing" should read --perform--; and
    Line 43, "flowing" should read --flowing across--.

COLUMN 6:

Line 16, "(an" should read --a--;
    Line 33, "a" should read --as--; and
    Line 39, "ferric chloride" should read --ferric chloride,--.

COLUMN 9:

Line 20, "an" should read --a--;
    Line 29, "structure" should read --structures--;
    Line 47, "insulating" should read --insulate--; and
    Line 50, "e" should read --be--.

UNITED STATES PATENT AND TRADEMARK OFFICE
CERTIFICATE OF CORRECTION

PATENT NO.   : 5,993,637
DATED        : November 30, 1999
INVENTOR(S)  : MASAYA HISAMATSU ET AL.

It is certified that error appears in the above-identified patent and that said Letters Patent is hereby corrected as shown below:

COLUMN 10:

Line 41, "complicate" should read --complicated--.

COLUMN 11:

Line 1, "include" should read --includes--;
Line 7, "include" should read --includes--;
Line 51, "with" should read --connected to--; and
Line 66, "elctrolysis" should read --electrolysis--.

COLUMN 13:

Line 2, "with peeling and scar of the ITO surface here" should read --by peeling and scarring of the ITO surface where--; and
Line 45, "A: should read --At--.

COLUMN 15:

Line 46, "region" should read --regions--.

UNITED STATES PATENT AND TRADEMARK OFFICE
CERTIFICATE OF CORRECTION

| | | |
|---|---|---|
| PATENT NO. | : | 5,993,637 |
| DATED | : | November 30, 1999 |
| INVENTOR(S) | : | MASAYA HISAMATSU ET AL. |

It is certified that error appears in the above-identified patent and that said Letters Patent is hereby corrected as shown below:

COLUMN 16:

Line 56, "lien" should read --line--.

Signed and Sealed this

Thirteenth Day of February, 2001

*Attest:*

NICHOLAS P. GODICI

*Attesting Officer*     Acting Director of the United States Patent and Trademark Office